United States Patent
Guo et al.

(10) Patent No.: US 11,908,971 B1
(45) Date of Patent: Feb. 20, 2024

(54) PHOTOVOLTAIC MODULE AND MANUFACTURING METHOD THEREOF

(71) Applicants: SHANGHAI JINKO GREEN ENERGY ENTERPRISE MANAGEMENT CO., LTD., Shanghai (CN); ZHEJIANG JINKO SOLAR CO., LTD., Zhejiang (CN)

(72) Inventors: Zhiqiu Guo, Zhejiang (CN); Yidong Hu, Zhejiang (CN); Yichao Yao, Zhejiang (CN)

(73) Assignees: SHANGHAI JINKO GREEN ENERGY ENTERPRISE MANAGEMENT CO., LTD., Shanghai (CN); ZHEJIANG JINKO SOLAR CO., LTD., Haining (CN)

( * ) Notice: Subject to any disclaimer, the term of this patent is extended or adjusted under 35 U.S.C. 154(b) by 0 days.

(21) Appl. No.: 18/078,676

(22) Filed: Dec. 9, 2022

(30) Foreign Application Priority Data

Oct. 26, 2022 (CN) .......................... 202211320245.3

(51) Int. Cl.
*H01L 31/18* (2006.01)
*H01L 31/042* (2014.01)
(Continued)

(52) U.S. Cl.
CPC .......... *H01L 31/186* (2013.01); *B23K 1/0056* (2013.01); *H01L 31/02021* (2013.01); *H01L 31/042* (2013.01)

(58) Field of Classification Search
CPC ............. H01L 31/186; H01L 31/02021; H01L 31/042; B23K 1/0056; H01H 2207/02; H01H 2229/04
See application file for complete search history.

(56) References Cited

U.S. PATENT DOCUMENTS

2011/0285840 A1 11/2011 Benson et al.
2012/0024373 A1 2/2012 Dubbeldam
(Continued)

FOREIGN PATENT DOCUMENTS

CN 102646741 A 8/2012
CN 104377263 A 2/2015
(Continued)

OTHER PUBLICATIONS

Office Action issued in corresponding JP Application 2022-189426, dated Mar. 24, 2023, and an English Translation, 6 pages.
(Continued)

*Primary Examiner* — Tae-Sik Kang
(74) *Attorney, Agent, or Firm* — Burris Law, PLLC

(57) ABSTRACT

A photovoltaic module, including a laminate including a solder strip; and a junction box arranged on a surface of the laminate and including a plate connected to the solder strip by laser soldering. The plate has a first region and a second region, in which a region covered by the solder strip on the plate is the first region, and a region not covered by the solder strip on the plate is the second region. A soldering seam formed by laser soldering includes a first soldering seam and a second soldering seam. The first soldering seam is located in the first region, and the first soldering seam extends through the solder strip into the plate along a thickness direction of the laminate. The second soldering seam is located in the second region, and the second soldering seam extends directly into the plate along the thickness direction of the laminate.

20 Claims, 4 Drawing Sheets

(51) Int. Cl.
    *H01L 31/02*    (2006.01)
    *B23K 1/005*    (2006.01)

(56) References Cited

U.S. PATENT DOCUMENTS

| | | |
|---|---|---|
| 2013/0032207 A1 | 2/2013 | Oberrisser et al. |
| 2019/0198691 A1 | 6/2019 | Fan et al. |
| 2022/0224285 A1 | 7/2022 | Huang et al. |

FOREIGN PATENT DOCUMENTS

| | | |
|---|---|---|
| CN | 104485884 A | 4/2015 |
| CN | 208556647 U | 3/2019 |
| CN | 210839471 U | 6/2020 |
| CN | 212323016 U | 1/2021 |
| CN | 114029572 A | 2/2022 |
| CN | 114799525 A | 7/2022 |
| DE | 102011052928 A1 | 8/2012 |
| EP | 2517265 B1 | 11/2017 |

OTHER PUBLICATIONS

Extended European Search Report issued in corresponding EP Application 22210452.3, dated Aug. 10, 2023, 8 pages.
Office Action issued in corresponding AU Application 2022279394, dated Dec. 18, 2023, 7 pages.

PHOTOVOLTAIC MODULE AND MANUFACTURING METHOD THEREOF

CROSS-REFERENCE TO RELATED APPLICATIONS

This application claims priority to and the benefit of Chinese Patent Application No. 202211320245.3 filed on Oct. 26, 2022, the content of which is incorporated herein by reference in its entirety.

FIELD

The present disclosure relates to the technical field of photovoltaic products, and in particular, to a photovoltaic module and a manufacturing method thereof.

BACKGROUND

The statements in this section merely provide background information related to the present disclosure and may not constitute prior art.

A junction box is a key connection device for a photovoltaic module to implement voltage output. In practice, an electrode of a laminate is required to be electrically connected to a plate in the junction box through a solder strip. In the related art, the solder strip is generally fixed and connected to the plate in the junction box by soldering, such as thermocompression bonding. On the one hand, a solder material needs to be prepared and molten in the soldering, which requires complicated machining operations. On the other hand, a melting point of the solder material is different from melting points of the solder strip and the plate, which is prone to desoldering due to thermal shock, resulting in poor reliability of the connection between the solder strip and the plate.

The solder strip and the plate may also be fixed and connected by laser soldering. The plate and the solder strip can be directly molten to form a soldering seam by the laser soldering. Therefore, there is no need to provide any solder material and the connection is relatively reliable. However, the laser welding also has problems such as poor soldering efficiency.

SUMMARY

This section provides a general summary of the disclosure and is not a comprehensive disclosure of its full scope or all of its features.

The present disclosure provides a photovoltaic module and a manufacturing method thereof. The photovoltaic module improves production efficiency by reducing the difficulty of positioning prior to soldering.

An embodiment of the present disclosure provides a photovoltaic module. The photovoltaic module includes: a laminate including a solder strip; and a junction box arranged on a surface of the laminate and including a plate connected to the solder strip by laser soldering. The plate has a first region and a second region, in which a region covered by the solder strip on the plate is the first region, and a region not covered by the solder strip on the plate is the second region. A soldering seam formed by laser soldering includes a first soldering seam and a second soldering seam. The first soldering seam is located in the first region, and the first soldering seam extends through the solder strip into the plate along a thickness direction of the laminate. The second soldering seam is located in the second region, and the second soldering seam extends directly into the plate along the thickness direction of the laminate.

In one or more embodiments, the soldering seam formed by laser soldering further comprises a third soldering seam having one part located in the first region and the other part located in the second region. Along the thickness direction of the laminate, the part of the third soldering seam located in the first region extends through the solder strip into the plate, and the part located in the second region extends directly into the plate.

In one or more embodiments, the plate is provided with at least 6 soldering seams.

In one or more embodiments, a sum of a number of the first soldering seam and a number of the third soldering seam is greater than or equal to three.

In one or more embodiments, along the thickness direction of the laminate, a ratio $n_1$ of an extension depth of the part of the third soldering seam located in the first region within the plate to a thickness of the plate satisfies: $5\% \leq n_1 \leq 60\%$; and/or a ratio $n_2$ of an extension depth of the other part of the third soldering seam located in the second region within the plate to the thickness of the plate satisfies: $40\% \leq n_2 \leq 80\%$.

In one or more embodiments, along the thickness direction of the laminate, a ratio of an extension depth of the first soldering seam within the plate to the thickness of the plate is in a range of 5% to 60%; and/or a ratio of an extension depth of the second soldering seam within the plate to the thickness of the plate is in a range of 40% to 80%.

In one or more embodiments, a width of the solder strip is L1, and a width of the plate is L2, and L1, L2 satisfy: $0.2 \leq L1/L2 \leq 0.8$.

An embodiment of the present disclosure further provides a method for manufacturing a photovoltaic module, the photovoltaic module includes a laminate having a solder strip and a junction box having a plate. The method includes the following steps: providing the laminate; arranging the junction box on the laminate so that the solder strip of the laminate extends into the junction box; acquiring a position of the plate; pressing the solder strip against the plate in the junction box; laser-soldering the solder strip and the plate by using a laser head, a first soldering seam formed after soldering extends through the solder strip into the plate, and a second soldering seam extends directly into the plate; and visually inspecting the first soldering seam.

In one or more embodiments, the step of acquiring a position of the plate includes: photographing the junction box; and acquiring the position of the plate according to a photographing result.

In one or more embodiments, the plate has a first region and a second region, a region covered by the solder strip on the plate is the first region, and a region not covered by the solder strip on the plate is the second region; and in the step of laser-soldering the solder strip and the plate by using a laser head, the laser head emits lasers to the first region and the second region.

In one or more embodiments, in the step of laser-soldering the solder strip and the plate by using a laser head, a power P of lasers emitted by the laser head satisfies: $550\,W \leq P \leq 750\,W$; and a soldering speed v of the laser head satisfies: $60\,mm/s \leq v \leq 100\,mm/s$.

In one or more embodiments, the step of visually inspecting the first soldering seam includes: photographing the solder strip; and detecting whether a width d of a soldering seam on the solder strip satisfies: $0.3\,mm \leq d \leq 0.4\,mm$.

It is to be understood that the general description above and the detailed description below are only examples and cannot limit the present disclosure.

Further areas of applicability will become apparent from the description provided herein. It should be understood that the description and specific examples are intended for purposes of illustration only and are not intended to limit the scope of the present disclosure.

DRAWINGS

In order that the disclosure may be well understood, there will now be described various forms thereof, given by way of example, reference being made to the accompanying drawings, in which.

Figure 1:
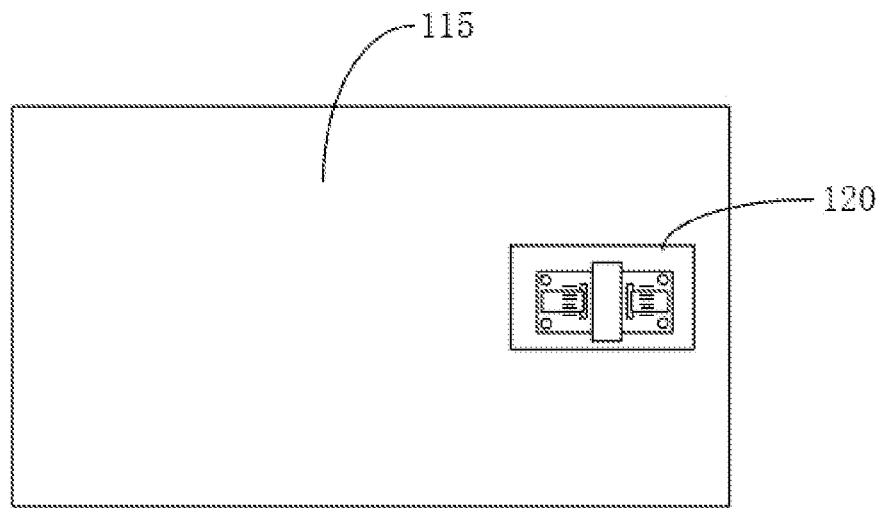
FIG. 1 is a schematic structural diagram of a photovoltaic module according to one or more embodiments of the present disclosure.

The drawings described herein are for illustration purposes only and are not intended to limit the scope of the present disclosure in any way.

DETAILED DESCRIPTION

The following description is merely exemplary in nature and is not intended to limit the present disclosure, application, or uses. It should be understood that throughout the drawings, corresponding reference numerals indicate like or corresponding parts and features.

In order to better understand the technical solution of the present disclosure, embodiments of the present disclosure are described in detail below with reference to the accompanying drawings.

It is to be made clear that the described embodiments are only some rather than all of the embodiments of the present disclosure. All other embodiments obtained by those of ordinary skill in the art based on the embodiments in the present disclosure without creative efforts fall within the protection scope of the present disclosure.

The terms used in the embodiments of the present disclosure are intended only to describe particular embodiments and are not intended to limit the present disclosure. As used in the embodiments of the present disclosure and the appended claims, the singular forms of "a/an", "the", and "said" are intended to include plural forms, unless otherwise clearly specified by the context.

It is to be understood that the term "and/or" used herein is merely an association relationship describing associated objects, indicating that three relationships may exist. For example, A and/or B indicates that there are three cases of A alone, A and B together, and B alone. In addition, the character "I" herein generally means that associated objects before and after it are in an "or" relationship.

It is to be noted that the location terms such as "above", "below", "left", and "right" described in the embodiments of the present disclosure are described with reference to the angles shown in the accompanying drawings, and should not be construed as limitations on the embodiments of the present disclosure. In addition, in the context, it is to be further understood that, when one element is referred to as being connected "above" or "below" another element, the one element may be directly connected "above" or "below" another element, or connected "above" or "below" another element via an intermediate element.

Figure 3:
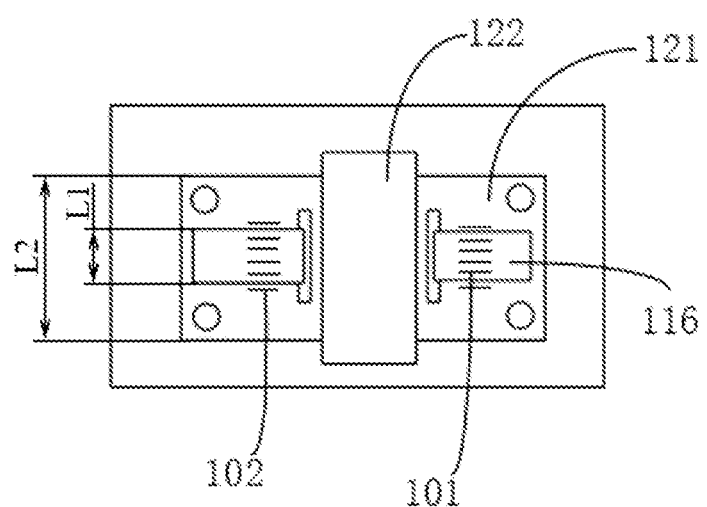
FIG. 3 is a schematic structural diagram showing connection between a solder strip and a plate within a junction box in FIG. 1.

Embodiments of the present disclosure provide a photovoltaic module 10. As shown in FIG. 1 and FIG. 3, the photovoltaic module 10 includes: a laminate 110 and a junction box 120. The laminate 110 is provided with a solder strip 116. The junction box 120 is arranged on a surface of the laminate 110. The junction box 120 is provided with a plate 121. The solder strip 116 is connected to the plate 121 by soldering, including arc soldering, argon arc soldering, carbon-dioxide arc soldering, laser soldering, electro-slag pressure soldering, and the like. Laser soldering is adopted in the present disclosure.

The laminate 110 can generate a current under sunlight. The current generated is collected through the solder strip 116 and transported to the junction box 120. The junction box 120 is first connected to other components in series through cables, and then electrically connected to an external electrical control device, so that the photovoltaic module 10 can supply power to the external electrical control device.

Figure 5:
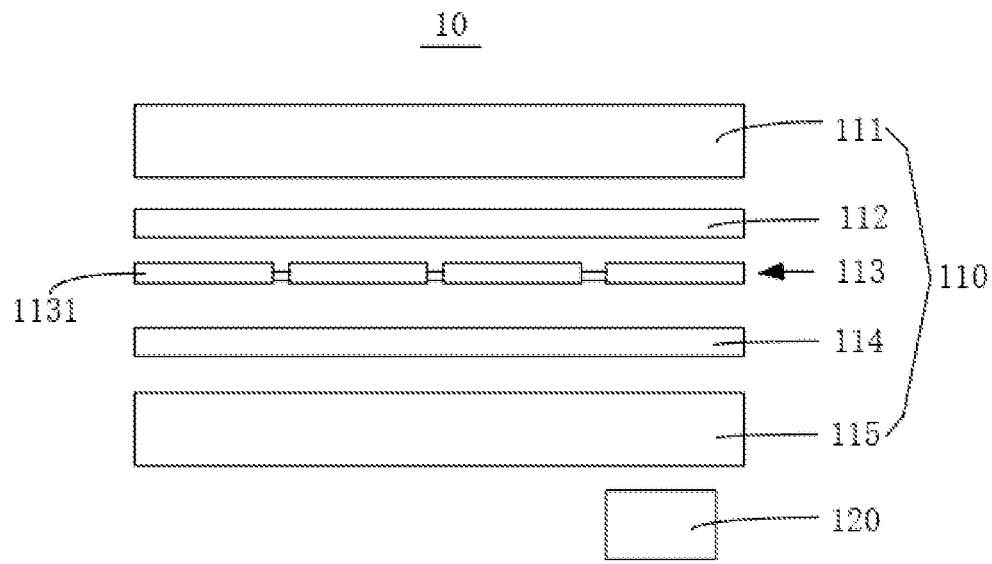
FIG. 5 is a schematic structural diagram of composition of the photovoltaic module according to one or more embodiments of the present disclosure.

As shown in FIG. 5, the laminate 110 is laminated by successively stacking a cover plate 111, a first encapsulation adhesive film 112, a group of solar cell strings 113, a second encapsulation adhesive film 114, and a back plate 115. The group of solar cell strings 113 includes a plurality of solar cells 1131. The solder strip 116 is electrically connected to the group of solar cell strings 113 and threaded through the back plate 115, so as to derive electric energy of the solar cells 1131 in the group of solar cell strings 113.

Figure 2:
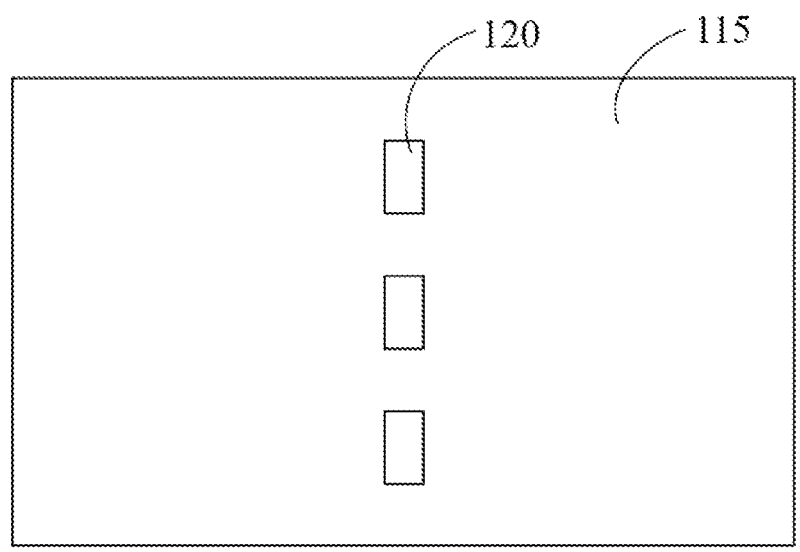
FIG. 2 is a schematic structural diagram of the photovoltaic module according to one or more embodiments of the present disclosure.

The junction box 120 is generally arranged on a rear surface of the laminate 110, that is, a position near the back plate 115, which prevents the influence on photoelectric conversion efficiency of the laminate 110 due to the blocking by the junction box 120. As shown in FIG. 2, the laminate 110 may be provided with one or more junction boxes 120. For example, a number of the junction boxes 120 arranged on the laminate 110 may be 2 to 6, for example 3. The junction box 120 may be located at an edge of the laminate 110 or an inner side near the center of the laminate 110. Further, the junction box 120, when arranged at the inner side near the center of the laminate 110, is arranged on, for example, a center line of the laminate 110, and may further be arranged on a center line of a long side of the laminate 110.

The solder strip 116 is laser-soldered with the plate 121. During the laser soldering, a high temperature is generated through energy of a laser beam to melt metal materials of the solder strip 116 and the plate 121, so that the metal materials of the solder strip 116 and the plate 121 are fused and formed into an integrated structure after cooling and solidification. Thus, the connection between the solder strip 116 and the plate 121 is realized, and the connection is relatively reliable. In an embodiment, when the solder strip 116 and the plate 121 are made of a same material such as copper metal, fusion between the same metal of the solder strip 116 and the plate 121 can further improve strength of the connection between the solder strip 116 and the plate 121, which is not prone to desoldering. In addition, during the laser soldering, since both the solder strip 116 and the plate 121 generate soldering seams through their own molten metal, there is no need to provide any further solder material, thereby facilitating the manufacturing process.

As shown in FIG. 3, the plate 121 is provided with a first region and a second region. A region covered by the solder strip 116 on the plate 121 is the first region, and a region not covered by the solder strip 116 on the plate 121 is the second region. A soldering seam formed by laser soldering includes a first soldering seam 101 and a second soldering seam 102. The first soldering seam 101 is located in the first region, and the first soldering seam 101 extends through the solder strip 116 into the plate 121 along a thickness direction of the laminate 110. The second soldering seam 102 is located in the second region, and the second soldering seam 102 extends directly into the plate 121 along the thickness direction of the laminate 110. The second region may be on one side of the first region, or on both sides of the first region.

In some embodiments, as shown in FIG. 3, soldering seams are formed in both the first region and the second region. That is, during the laser soldering of the solder strip 116 with the plate 121, a soldering region includes the first region and the second region. Therefore, there is no need to accurately position the solder strip 116 prior to laser soldering, only the plate 121 is required to be positioned, and then the first region and the second region on the plate 121 are laser-soldered, which reduces difficulty of positioning prior to soldering and improves production efficiency, so as to achieve fast takt time of a production line.

Figure 4:
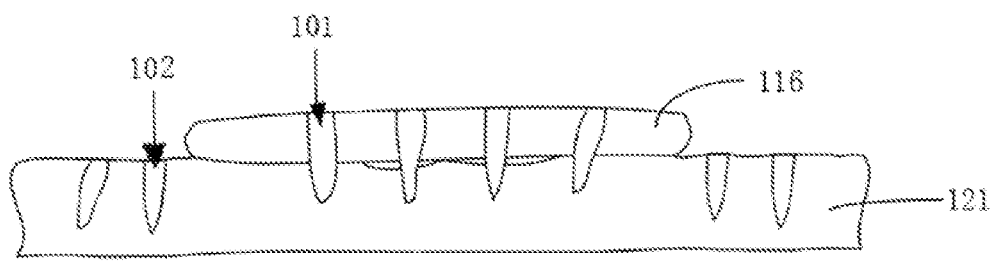
FIG. 4 is a schematic structural diagram of a first soldering seam and a second soldering seam in FIG. 3.

As shown in FIG. 3 and FIG. 4, when the first region and the second region on the plate 121 are laser-soldered, the first soldering seam 101 is formed in the first region, and the first soldering seam 101 extends through the solder strip 116 into the plate 121, so as to realize a stable connection between the solder strip 116 and the plate 121.

In one or more embodiments, the soldering seam formed by laser soldering further includes a third soldering seam, the third soldering seam has one part located in the first region and the other part located in the second region. Along the thickness direction of the laminate 110, the part of the third soldering seam located in the first region extends through the solder strip 116 into the plate 121, and the part located in the second region extends directly into the plate 121.

The soldering seam extends generally along a length direction or a width direction of the plate 121. During the laser soldering, both the first region and the second region on the plate 121 are laser-soldered. Therefore, an extension direction of the solder strip 116 above the plate 121 is not required to be parallel to an extension direction of the soldering seam, and part of the soldering seam can be formed on the solder strip 116. That is, the extension direction of the solder strip 116 above the plate 121 may be inclined relative to the extension direction of the soldering seam, so as to reduce difficulty of flattening the solder strip 116 onto the plate 121 and further improving the production efficiency. In an embodiment, when the solder strip 116 is inclined relative to the length direction or the width direction of the plate 121 and the extension direction of the soldering seam is parallel to the width direction or the length direction of the plate 121, the extension direction of the soldering seam is also inclined relative to the solder strip 116. In this case, a third soldering seam may be formed by laser soldering. The third soldering seam has one part located in the first region and the other part located in the second region. That is, along a direction perpendicular to the thickness direction of the laminate 110, the third soldering seam extends from the solder strip 116 to the plate 121 (or extends from the plate 121 to the solder strip 116). In this way, it is more difficult for the solder strip 116 to be separated from the plate 121, so that the connection between the solder strip 116 and the plate 121 is more reliable.

It may be understood that, when the solder strip 116 is parallel to the length direction or the width direction of the plate 121 and the extension direction of the soldering seam is inclined relative to the width direction or the length direction of the plate 121, the extension direction of the soldering seam is also inclined relative to the solder strip 116. In this case, a third soldering seam may also be formed by laser soldering.

In addition to a straight line shape, the soldering seam may also be in a curved shape or a wave shape. When the soldering seam is in a curved shape or a wave shape, an overall extension direction of the soldering seam may also be inclined relative to or parallel to the width direction or the length direction of the plate 121. The following descriptions are all based on the soldering seam in the straight line shape.

In some embodiments, as shown in FIG. 3, the plate 121 is provided with at least 6 soldering seams. For example, the number of the soldering seam may be 6, 7, 8, or the like.

For example, as shown in FIG. 3, the number of the soldering seam on the plate 121 should not be excessively small. If the number of soldering seam is excessively small (for example, less than 6), the number of the first soldering seam 101 falling into the first region will be correspondingly small, which brings poor reliability of the connection between the solder strip 116 and the plate 121. Therefore, when the plate 121 is provided with at least 6 soldering seams by laser soldering, more first soldering seams 101 may fall into the first region, so as to ensure a relatively reliable connection between the solder strip 116 and the plate 121.

In some embodiments, a sum of numbers of the first soldering seam 101 and the third soldering seam is greater than or equal to three. For example, the sum of numbers of the first soldering seam 101 and the third soldering seam may be 3, 4, or the like.

The sum of numbers of the first soldering seam 101 and the third soldering seam should not be excessively small. If the sum of numbers of the first soldering seam 101 and the third soldering seam is excessively small (for example, less than 3), the reliability of the connection between the solder strip 116 and the plate 121 is low. Therefore, a relatively reliable connection between the solder strip 116 and the plate 121 can be ensured when the sum of numbers of the first soldering seam 101 and the third soldering seam is greater than or equal to three.

In some embodiments, as shown in FIG. 4, along the thickness direction of the laminate 110, a ratio of an extension depth of the first soldering seam 101 within the plate 121 to a thickness of the plate 121 is in a range of 5% to 60% (for example, the ratio may be 5%, 10%, 20%, 40%, 60%, or the like); and/or a ratio of an extension depth of the second soldering seam 102 within the plate 121 to the thickness of the plate 121 is in a range of 40% to 80% (for example, the ratio may be 40%, 50%, 60%, 70%, 80%, or the like).

It is to be noted that the extension depth of the soldering seam within the plate 121 is related to irradiation power and irradiation duration of lasers. Since irradiation power and irradiation duration of lasers during the laser welding are generally fixed, the extension depth of the second soldering seam 102 within the plate 121 is greater than the extension depth of the first soldering seam 101 within the plate 121, and the extension depth of the second soldering seam 102 within the plate 121 increases as the extension depth of the first soldering seam 101 within the plate 121 increases.

As shown in FIG. 4, along the thickness direction of the laminate 110, the ratio of the extension depth of the first soldering seam 101 within the plate 121 to the thickness of the plate 121 should not be excessively small or excessively large; and/or the ratio of the extension depth of the second soldering seam 102 within the plate 121 to the thickness of the plate 121 should not be excessively small or excessively large. If the ratio of the extension depth of the first soldering seam 101 within the plate 121 to the thickness of the plate 121 is excessively small (for example, less than 5%), the extension depth of the first soldering seam 101 within the plate 121 is excessively small, poor contact easily occurs between the solder strip 116 and the plate 121, which adversely affects power supply of the photovoltaic module 10 to the external electrical control device. If the ratio of the extension depth of the first soldering seam 101 within the plate 121 to the thickness of the plate 121 is excessively large (for example, greater than 60%), the ratio of the extension depth of the second soldering seam 102 within the plate 121 to the thickness of the plate 121 is also excessively large (for example, greater than 80%), as a result, the second soldering seam 102 may penetrate through the plate 121 and touch the bottom of the junction box 120, thereby damaging the laminate 110.

Therefore, along the thickness direction of the laminate 110, when the ratio of the extension depth of the first soldering seam 101 within the plate 121 to the thickness of the plate 121 is in a range of 5% to 60%, and/or the ratio of the extension depth of the second soldering seam 102 within the plate 121 to the thickness of the plate 121 is in a range of 40% to 80%, damages to the laminate 110 caused by penetration of the second soldering seam 102 through the plate 121 can be effectively prevented and the reliability of the connection between the solder strip 116 and the plate 121 is thus ensured.

In some embodiments, along the thickness direction of the laminate 110, a ratio n1 of an extension depth of the part of the third soldering seam located in the first region within the plate 121 to a thickness of the plate 121 satisfies: $5\% \le n1 \le 60\%$; and/or a ratio n2 of an extension depth of the other part of the third soldering seam located in the second region within the plate 121 to the thickness of the plate 121 satisfies: $40\% \le n2 \le 80\%$.

Since the part of the third soldering seam located in the first region extends through the solder strip 116 into the plate 121, extension of the part of the third soldering seam located in the first region within the plate 121 is similar to the extension of the first soldering seam 101 within the plate 121. Since the part of the third soldering seam located in the second region extends directly into the plate 121, extension of the part of the third soldering seam located in the second region within the plate 121 is similar to the extension of the second soldering seam 102 within the plate 121.

In addition, due to possible error in the manufacturing device or possible error in the method for manufacturing the photovoltaic module 10, extension depths of adjacent first soldering seams 101 in the first region within the plate 121 may differ greatly or extension depths of adjacent second soldering seams 102 in the second region within the plate 121 may differ greatly. In actual production, a ratio of a difference between the extension depths of the adjacent first soldering seams 101 or second soldering seams 102 within the plate 121 to the thickness of the plate 121 may be up to 20%. Therefore, in the present disclosure, a larger range is set for the extension depths of the first soldering seam 101, the second soldering seam 102, and the third soldering seam within the plate 121, which reduces requirements on accuracy of the manufacturing device and the method for manufacturing the photovoltaic module 10.

In some embodiments, as shown in FIG. 3, a width of the solder strip 116 is L1, and a width of the plate 121 is L2, which satisfy: $0.2 \le L1/L2 \le 0.8$. For example, L1/L2 may be, 0.2, 0.4, 0.6, 0.8, or the like.

As shown in FIG. 3, the width L1 of the solder strip 116 is also a width of the first region, and the width L2 of the plate 121 is also widths of the first region and the second region. The ratio L1/L2 of the width L1 of the solder strip 116 to the width L2 of the plate 121 should not be excessively large or excessively small. If the ratio L1/L2 is excessively large (for example, greater than 0.8), the width of the plate 121 is excessively small, which increases the difficulty of positioning the plate 121 prior to soldering and the time required by the positioning, and thus reduces manufacturing efficiency of the photovoltaic module 10. If the ratio L1/L2 is excessively small (for example, less than 0.2), the width of the plate 121 is excessively large, and only a small number of soldering seams or no soldering seam may extend through the solder strip 116 to the plate 121, resulting in an unreliable connection or no connection between the solder strip 116 and the plate 121. Therefore, the reliability of the connection and the manufacturing efficiency of the solder strip 116 and the plate 121 can be ensured only when the ratio L1/L2 of the width L1 of the solder strip 116 to the width L2 of the plate 121 satisfies: $0.2 \le L1/L2 \le 0.8$.

As shown in FIG. 5, a device for manufacturing a photovoltaic module 10 includes: a carrying mechanism 20, a pressing mechanism 30, a laser head a first detector 50, and a second detector 60. The carrying mechanism 20 is configured to carry the photovoltaic module 10 and drive the photovoltaic module 10 to move. The pressing mechanism 30 is configured to press the solder strip 116 against the plate 121. The laser head 40 is configured to laser-solder the solder strip 116 with the plate 121. The first detector 50 is configured to position the plate 121. The second detector 60 is configured to detect soldering seams.

Figure 6:
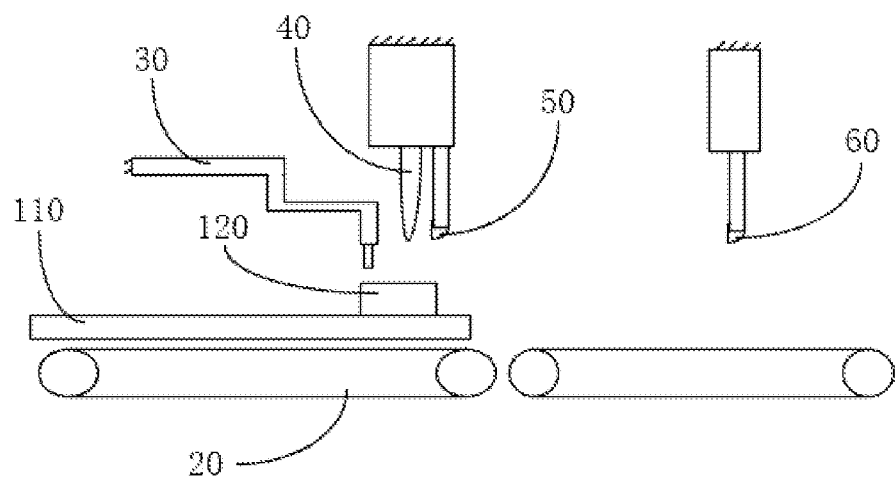
FIG. 6 is a schematic structural diagram of a device for manufacturing a photovoltaic module according to one or more embodiments of the present disclosure.
Figure 7:
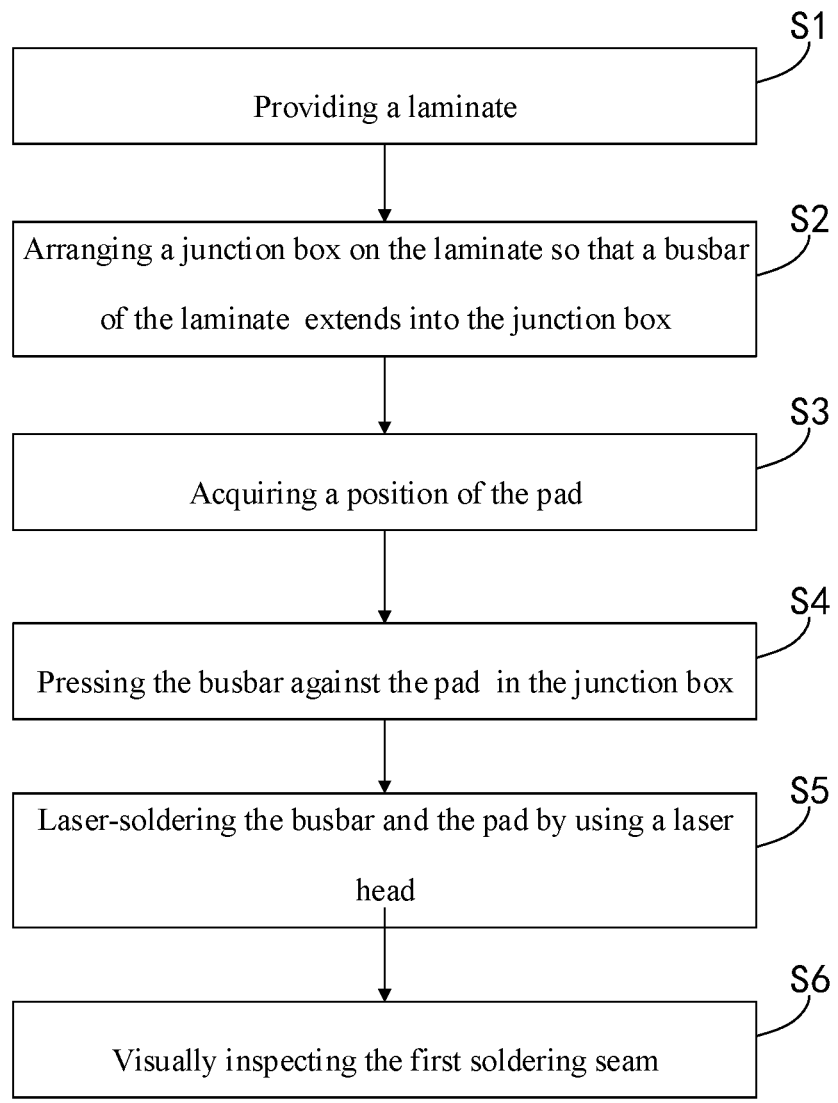
FIG. 7 is a flowchart of a method for manufacturing a photovoltaic module according to one or more embodiments of the present disclosure.

The present disclosure further provides a method for manufacturing a photovoltaic module. As shown in FIG. 6 and FIG. 7, the method for manufacturing a photovoltaic module includes the following steps:

In S1, the laminate 110 is provided.

In this step, the laminate 110 is placed on the carrying mechanism 20.

In S2, the junction box 120 is arranged on the laminate 110 so that the solder strip 116 of the laminate 110 extends into the junction box 120.

In this step, the junction box 120 is provided with an opening that enables the solder strip 116 to pass through. The junction box 120 is placed corresponding to the solder strip 116 so that the solder strip 116 passes through the opening.

In S3, a position of the plate 121 is acquired.

In this step, the first detector 50 can detect the position of the plate 121. The first detector 50 may be a CCD visual inspection system or the like.

In S4, the solder strip 116 is pressed against the plate 121 in the junction box 120.

In this step, the pressing mechanism 30 can move relative to the carrying mechanism 20, so as to contact the solder strip 116 to press the solder strip 116 against the plate 121.

In some embodiments, the junction box 120 is further provided with a diode 122. The diode 122 can be electrically connected to the solder strip 116 and configured to protect the photovoltaic module 10 from anomaly. The plate 121 in the junction box 120 may be formed by a conductive terminal part of the diode 122. That is, the conductive terminal part of the diode 122 is extended into a plane shape with a certain area, in order to realize a connection with the solder strip 116. The plate 121 in the junction box 120 may also be an individual plate component. That is, the individual plate component is secured to the junction box 120 through a fastener such as an anchor, and the individual plate component is connected to the conductive terminal of the diode 122.

In S5, the solder strip 116 is laser-soldered with the plate 121 by using a laser head 40, a first soldering seam 101 formed after soldering extends through the solder strip 116 into the plate 121, and a second soldering seam 102 extends directly into the plate 121.

In this step, the laser head 40 may emit a laser of specific power to realize the soldering of the solder strip 116 with the plate 121.

When the laser emitted by the laser head 40 irradiates the first region, the laser may melt the solder strip 116 and the plate 121, and as the laser head 40 moves, the first soldering seam 101 may be formed on the path of the laser. When the laser emitted by the laser head 40 irradiates the second region, the laser may melt the plate 121, and as the laser head 40 moves, the second soldering seam 102 may be formed on the path of the laser. When the path of the laser emitted by the laser head 40 spans the first region and the second region, a third soldering seam may be formed on the path of the laser.

In S6, the first soldering seam 101 is visually inspected.

In this step, it may be determined whether the soldering seam formed after soldering satisfies the requirement by visual inspection on the soldering seam after laser soldering, so as to ensure the production yield of the photovoltaic module 10.

In some embodiments, in step S3, the step of acquiring a position of the plate 121 includes the following steps:

In S31, the junction box 120 is photographed.

In S32, the position of the plate 121 is acquired according to the photographing result.

The first detector 50 can photograph the junction box 120 so as to acquire the position of the plate 121 according to a shot image, so that the solder strip 116 is soldered onto the plate 121.

For example, in the step S5 of laser-soldering the solder strip 116 with the plate 121 by using a laser head 40, the laser head 40 emits lasers to the first region and the second region.

In some embodiments, as shown in FIG. 6 and FIG. 7, the laser soldering on both the first region and the second region reduces the difficulty of positioning the solder strip 116 and improves manufacturing efficiency of the photovoltaic module 10, so as to achieve fast takt time of the production line.

In the step S5 of laser-soldering the solder strip 116 with the plate 121 by using a laser head 40, power P of lasers emitted by the laser head 40 satisfies: 550 W≤P≤750 W; and a soldering speed v of the laser head 40 satisfies: 60 mm/s≤v≤100 mm/s. For example, the power P may be 550 W, 600 W, 650 W, 700 W, 750 W, or the like, and the soldering speed v may be, 60 mm/s, 70 mm/s, 80 mm/s, 90 mm/s, 100 mm/s, or the like.

In this embodiment, through the control over the soldering power P of the laser head 40, intensity of energy of the laser emitted by the laser head 40 when reaching a surface of the solder strip 116 can be controlled, so as to control the intensity of the energy of the laser reaching the surface of the solder strip 116 during the soldering to be within a reasonable range. An insufficiently reliable connection between the solder strip 116 and the plate 121 due to a shallow soldering depth caused by low intensity of the energy of the laser (for example, when the soldering power P is less than 550 W) is prevented, and the problem of melt-through of the plate 121 caused by relatively high energy of the laser (for example, when the soldering power P is greater than 750 W) is also prevented.

In addition, through the control over the soldering speed v of the laser head 40, the width of the soldering seam can be controlled, so that the soldering seam finally formed meets quality requirements. An excessively wide soldering seam due to long stay time of the laser in a soldering region caused by an excessively low soldering speed v (for example, when the soldering speed v is less than 60 mm/s) is prevented, and an excessively narrow soldering seam due to an excessively high soldering speed v (for example, when the soldering speed v is greater than 100 mm/s) is also prevented.

In some embodiments, step S6 of visually inspecting the first soldering seam 101 includes the following steps:

In S61, the solder strip 116 is photographed.

In S62, it is detected whether a width d of a soldering seam on the solder strip 116 satisfies: 0.3 mm≤d≤0.4 mm. For example, the width d of the soldering seam may be 0.3 mm, 0.32 mm, 0.35 mm, 0.38 mm, 0.4 mm, or the like.

The carrying mechanism 20 can move the photovoltaic module 10 after the soldering below the second detector, and the second detector 60 can photograph the solder strip 116 on the plate 121 and detect the width of the soldering seam on the solder strip 116. Since the width d of the soldering seam can reflect quality of soldering to some extent, it may be determined, through the width d of the soldering seam on the surface of the solder strip 116, whether the quality of soldering meets the requirement, so as to ensure the production yield of the photovoltaic module 10.

If the width d of the first soldering seam 101 is excessively small (for example, less than 0.3 mm) or the width d of the first soldering seam 101 is excessively large (for example, greater than 0.4 mm), it is considered that the quality of soldering does not meet the requirement. It is considered that the quality of soldering meets the requirement only when the width d of the first soldering seam 101 satisfies: 0.3 mm≤d≤0.4 mm.

The above are merely some embodiments of the present disclosure, and are not intended to limit the present disclosure. For those skilled in the art, the present disclosure may be subject to various modifications and changes. Any modification, equivalent replacement, improvement and the like within the spirit and principle of the present disclosure all fall within the protection scope of the present disclosure.

Unless otherwise expressly indicated herein, all numerical values indicating mechanical/thermal properties, compositional percentages, dimensions and/or tolerances, or other characteristics are to be understood as modified by the word "about" or "approximately" in describing the scope of the present disclosure. This modification is desired for various reasons including industrial practice, material, manufacturing, and assembly tolerances, and testing capability.

As used herein, the phrase at least one of A, B, and C should be construed to mean a logical (A OR B OR C), using a non-exclusive logical OR, and should not be construed to mean "at least one of A, at least one of B, and at least one of C."

The description of the disclosure is merely exemplary in nature and, thus, variations that do not depart from the substance of the disclosure are intended to be within the scope of the disclosure. Such variations are not to be regarded as a departure from the spirit and scope of the disclosure.

What is claimed is:

1. A photovoltaic module, comprising:
a laminate including a solder strip; and
a junction box arranged on a surface of the laminate and including a plate connected to the solder strip by laser soldering;
wherein the plate has a first region and a second region, in which a region covered by the solder strip on the plate is the first region, and a region not covered by the solder strip on the plate is the second region; and
wherein a soldering seam formed by the laser soldering includes a first soldering seam and a second soldering seam, the first soldering seam is located in the first region, and the first soldering seam extends through the solder strip into the plate along a thickness direction of the laminate, the second soldering seam is located in the second region, and the second soldering seam extends directly into the plate along the thickness direction of the laminate.

2. The photovoltaic module according to claim 1, wherein the soldering seam formed by the laser soldering further comprises a third soldering seam having one part located in the first region and the other part located in the second region; and
along the thickness direction of the laminate, the one part of the third soldering seam located in the first region extends through the solder strip into the plate, and the other part located in the second region extends directly into the plate.

3. The photovoltaic module according to claim 2, wherein the plate is provided with at least 6 soldering seams.

4. The photovoltaic module according to claim 2, wherein a sum of a number of the first soldering seam and a number of the third soldering seam is greater than or equal to three.

5. The photovoltaic module according to claim 2, wherein, along the thickness direction of the laminate, a ratio n1 of an extension depth of the one part of the third soldering seam located in the first region within the plate to a thickness of the plate satisfies: 5% $\leq$ n1 $\leq$ 60%.

6. The photovoltaic module according to claim 2, wherein, along the thickness direction of the laminate, a ratio n2 of an extension depth of the other part of the third soldering seam located in the second region within the plate to a thickness of the plate satisfies: 40% $\leq$ n2 $\leq$ 80%.

7. The photovoltaic module according to claim 1, wherein, along the thickness direction of the laminate, a ratio of an extension depth of the first soldering seam within the plate to the thickness of the plate is in a range of 5% to 60%.

8. The photovoltaic module according to claim 2, wherein, along the thickness direction of the laminate, a ratio of an extension depth of the first soldering seam within the plate to the thickness of the plate is in a range of 5% to 60%.

9. The photovoltaic module according to claim 5, wherein, along the thickness direction of the laminate, a ratio of an extension depth of the first soldering seam within the plate to the thickness of the plate is in a range of 5% to 60%.

10. The photovoltaic module according to claim 1, wherein, along the thickness direction of the laminate, a ratio of an extension depth of the second soldering seam within the plate to the thickness of the plate is in a range of 40% to 80%.

11. The photovoltaic module according to claim 2, wherein, along the thickness direction of the laminate, a ratio of an extension depth of the second soldering seam within the plate to the thickness of the plate is in a range of 40% to 80%.

12. The photovoltaic module according to claim 6, wherein, along the thickness direction of the laminate, a ratio of an extension depth of the second soldering seam within the plate to the thickness of the plate is in a range of 40% to 80%.

13. The photovoltaic module according to claim 1, wherein a width of the solder strip is L1, a width of the plate is L2, and L1, L2 satisfy: $0.2 \leq L1/L2 \leq 0.8$.

14. The photovoltaic module according to claim 2, wherein a width of the solder strip is L1, a width of the plate is L2, and L1, L2 satisfy: $0.2 \leq L1/L2 \leq 0.8$.

15. The photovoltaic module according to claim 1, wherein the junction box is arranged on a central line of a long side of the laminate.

16. A method for manufacturing a photovoltaic module, wherein the photovoltaic module comprises
a laminate including a solder strip; and a junction box arranged on a surface of the laminate and including a plate connected to the solder strip by laser soldering;
wherein the plate has a first region and a second region, in which a region covered by the solder strip on the plate is the first region, and a region not covered by the solder strip on the plate is the second region; and
wherein a soldering seam formed by the laser soldering includes a first soldering seam and a second soldering seam, the first soldering seam is located in the first region, and the first soldering seam extends through the solder strip into the plate along a thickness direction of the laminate, the second soldering seam is located in the second region, and the second soldering seam extends directly into the plate along the thickness direction of the laminate,
wherein the method for manufacturing a photovoltaic module comprises:
providing the laminate;
arranging the junction box on the laminate so that the solder strip of the laminate extends into the junction box;
acquiring a position of the plate;
pressing the solder strip against the plate in the junction box;
laser-soldering the solder strip and the plate by using a laser head, so that a first soldering seam formed after soldering extends through the solder strip into the plate, and a second soldering seam extends directly into the plate; and
visually inspecting the first soldering seam.

17. The method for manufacturing a photovoltaic module according to claim 16, wherein the acquiring a position of the plate comprises:
photographing the junction box; and acquiring the position of the plate according to a photographing result.

18. The method for manufacturing a photovoltaic module according to claim 16, wherein
during laser-soldering the solder strip and the plate by using a laser head, the laser head emits lasers to the first region and the second region.

19. The method for manufacturing a photovoltaic module according to claim 16, wherein, during the laser-soldering the solder strip and the plate by using a laser head, a power P of lasers emitted by the laser head satisfies: 550 W≤P≤750 W; and a soldering speed v of the laser head satisfies: 60 mm/s≤v≤100 mm/s.

20. The method for manufacturing a photovoltaic module according to claim 16, wherein the visually inspecting the first soldering seam comprises:
photographing the solder strip; and
detecting whether a width d of a soldering seam on the solder strip satisfies: 0.3 mm≤d≤0.4 mm.

* * * * *